United States Patent [19]

Napoli

[11] 4,392,009
[45] Jul. 5, 1983

[54] SOLAR POWER MODULE

[75] Inventor: Joseph D. Napoli, Windham, N.H.

[73] Assignee: Exxon Research and Engineering Co., Florham Park, N.J.

[21] Appl. No.: 312,032

[22] Filed: Oct. 16, 1981

[51] Int. Cl.³ ............................................. H01L 31/04
[52] U.S. Cl. .................................... 136/251; 136/244
[58] Field of Search ................................ 136/244, 251

[56] References Cited

U.S. PATENT DOCUMENTS

| 4,132,570 | 1/1979 | Caruso et al. | 136/244 |
| 4,139,399 | 2/1979 | Lindmayer | 136/251 |
| 4,257,821 | 3/1981 | Kelly et al. | 136/244 |
| 4,336,413 | 6/1982 | Tourneux | 136/251 |

Primary Examiner—Aaron Weisstuch
Attorney, Agent, or Firm—Robert S. Salzman

[57] ABSTRACT

A solar power module comprising an array of solar cells arranged on a flat panel, said panel being supported by a substantially rigid, easily assembled frame comprising spaced apart side channels that each interlock with adjacent and channels.

16 Claims, 4 Drawing Figures

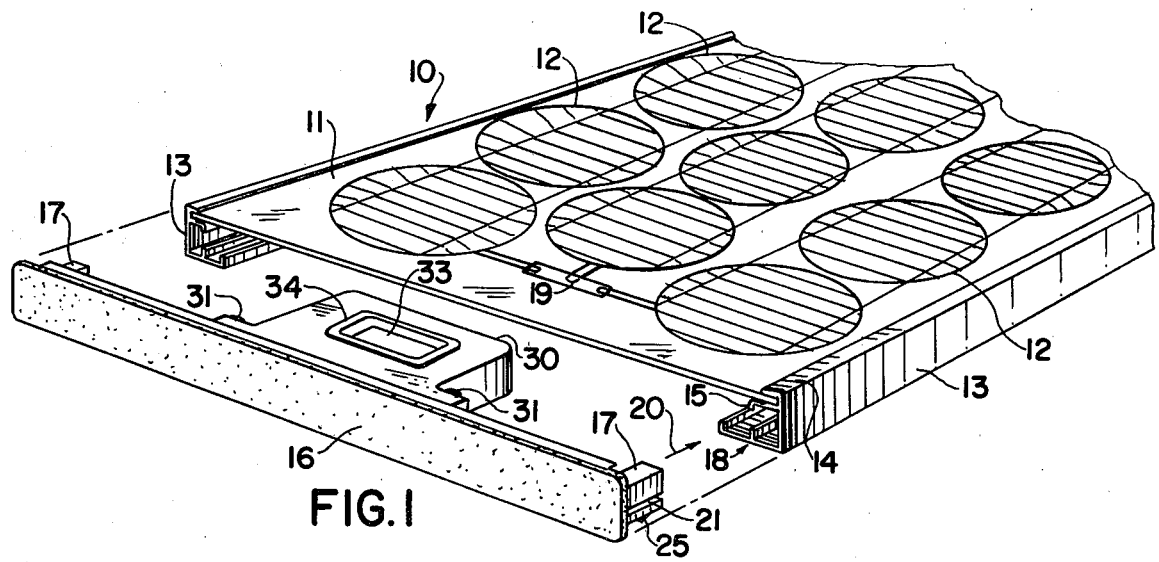
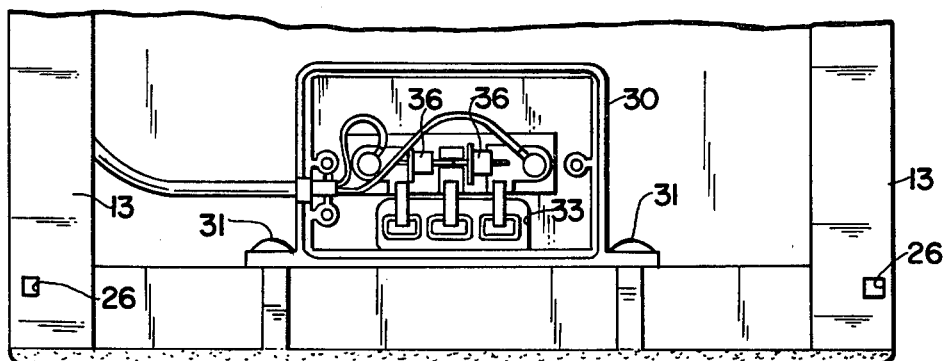
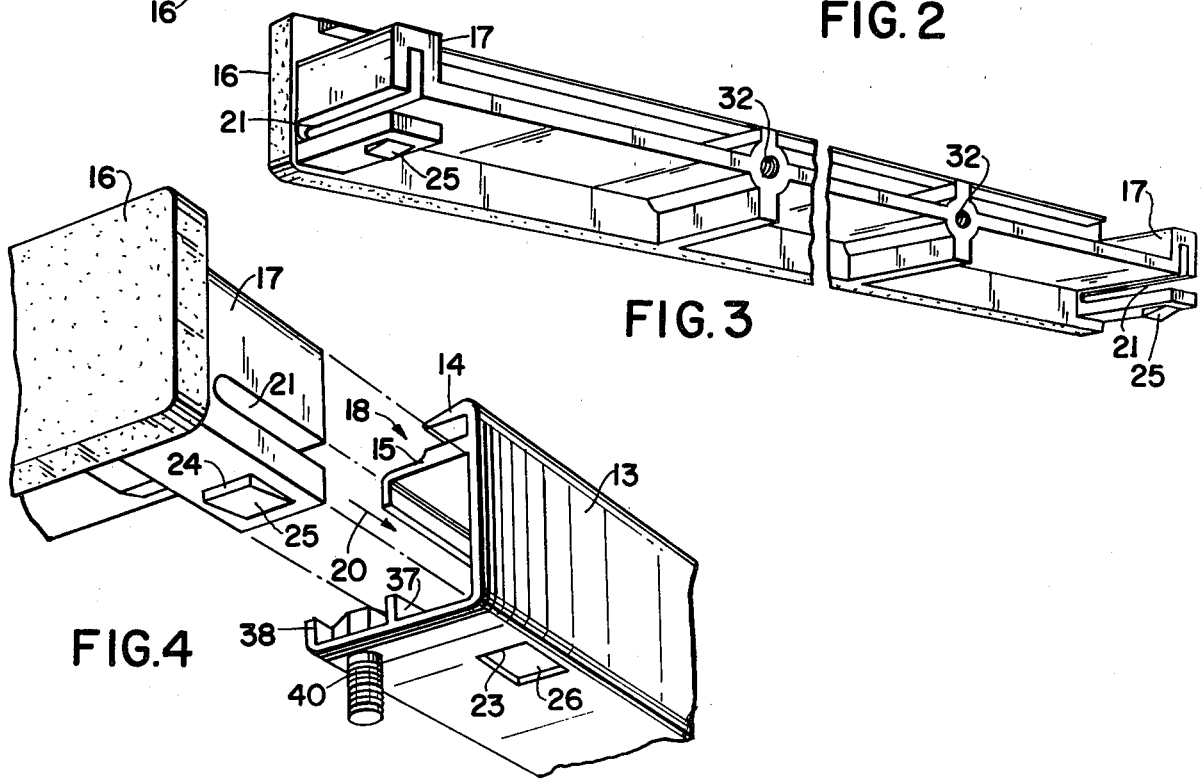

SOLAR POWER MODULE

FIELD OF THE INVENTION

This invention relates to an improved mass-produced solar power module, and more particularly to a solar power module having a substantially rigid easily-assembled integral construction.

BACKGROUND OF THE INVENTION

Heretofore, solar power modules have been manufactured on a hand-assembled basis. The frames of these modules are generally constructed with picture-frame techniques, wherein the end joints of the frame are mitered and screw-fastened.

To date, no one has commercialized a module constructed by mass-production assembly techniques, i.e., wherein the frame sections and solar cell panel are quickly and easily-assembled into a rigid, interlocking module.

Interlocking techniques also create the capability of quickly fabricating components by extrusion and molding processes. The use of light-weight materials, such as plastics and extruded aluminium is also made possible, when mass-production methods are employed.

DISCUSSION OF RELATED ART

To the best of our knowledge and belief, this is the first time that mass-production fabrication and assembly methods have been utilized to manufacture a solar power module.

BRIEF SUMMARY OF THE INVENTION

This invention pertains to a mass-produced solar power module. The module comprises an array of current-generating solar cells arranged upon a substantially flat panel. A substantially rigid, easily-assembled frame supports the panel. The frame has spaced-apart side channels that each interlock with adjacent end sections to form a rigid, easily-assembled and integral frame.

The end sections also include projecting tabs which extend into a hollow end portion of each of the channels. The tabs have a snap connector which locks said tab firmly within each hollow end portion of each channel.

A junction box of injection molded plastic is supported upon the frame. An aperture in the mid-portion of the junction box receives electrical leads from the solar panel. A circumferential seal is disposed about the periphery of the aperture. At least one diode is present in the solar cell circuit for preventing a back flow of current through at least a portion of the solar cell array, should a solar cell of the array develop a short. The diode is located inside the junction box where the solar cell array is comprised of three rows or circuit sections. There are three diodes, one for each row.

The side channels comprise extruded aluminium.

The end sections comprise injection molded plastic.

Each side channel contains an internal channel for securing an anchor bolt.

The tabs on each end section have a split-construction for allowing them to compressively fit within the hollow end portion of their respective channel.

The frame is substantially black in order to approximate the absorption coefficient of the solar cells of the panel, in order to provide temperature uniformity in the module.

It is an object of this invention to provide an improved solar power module.

It is another object of the invention to provide a solar power module which is fabricated and assembled by mass-production methods and materials.

These and other objects of this invention will be better understood and will become more apparent with reference to the following detailed description considered in conjunction with the accompanying drawings.

BRIEF DESCRIPTION OF THE DRAWINGS

FIG. 1 is an exploded perspective view of the solar power module of the invention;

FIG. 2 is a plan view of the junction box attached to the frame of the module shown in FIG. 1;

FIG. 3 is a perspective view of an end section of the frame of the moduule depicted in FIG. 1; and FIG. 4 is an exploded, partial perspective view illustrating the assembly of the frame, i.e., the connection of the end section to the side channel of the frame.

DETAILED DESCRIPTION OF THE INVENTION

Generally speaking, the invention features a mass-produced solar module which has been fabricated and assembled using mass-production methods and materials.

Referring to FIG. 1, a solar power module 10 is illustrated having a panel 11 upon which an array of solar cells 12 is shown. A frame surrounds panel 11, which frame is comprised of two side channels 13 and two end sections 16. The solar cells 12, depicted herein, are arranged in three rows which electrically feed to a common bus-bar 19.

The panel 11 is supported by the two, spaced-apart side channels 13. The panel 11 is disposed between two flanges 14 and 15, respectively, protruding from each channel 13, which flanges are shown in more detail in FIG. 4.

The channels 13 have an internal channel defined by flanges 37 and 38, respectively. This internal channel secures the head of a mounting bolt 40, such that the module may be mounted without placing a wrench behind the panel 11.

End section 16 on each end of panel 11 has a tab 17 on each end thereof, which tab 17 slides (arrow 20) into the respective hollow end portions 18 of each channel 13 as shown in FIGS. 1 and 4.

The tabs 17 are molded to conform to the flange 15 of the channel 13, as depicted in FIG. 4. The tabs 17 each have a split construction, as noted by the slot 21, as shown in FIGS. 3 and 4. The tabs 17 are made slightly larger than the hollow end portions 18 of the channels 13. The tabs 17 each can be compressed (due to slot 21) as they slide into the hollow end portion 18. This compressive fit allows for a firm interlocking of the end sections 16 with the side channels 13 to form a rigid, integral, easily-assembled frame.

To further insure a firm press-fit between end sections 16 and side channels 13, the tabs 17 are each provided with a raised snap connector 25. The snap connectors 25 slide into a respective hole 26 in channel 13, when the end section 16 mates with channel 13, as illustrated in FIG. 4.

Upon insertion of the tab 17 into hole 18, the edge 24 of the snap connector 25 becomes locked against edge 23 of hole 26, such that a secure interlock is formed by the mating end sections 13 and side channels 16.

The improved module also features a new junction box assembly. Most, if not all commercial modules presently have their junction box potted or adhered to the solar panel. This is a fragile connection, and is a source of concern in shipment.

The present invention has an injection molded junction box 30, which is fastened to the end section 16 of the module frame by screw fasteners 31, as shown in FIG. 2. The end section 16 has screw threaded holes 32 into which screws 31 are inserted as depicted in FIG. 3.

An electrical connection is made with the bus-bar 19 (FIG. 1) through an aperture 33 in a mid portion of the junction box 30. A sealed raised lip 34 circumscribes the periphery of aperture 33.

In the present solar panel design, three circuit sections or rows of solar cells are shown (FIG. 1). Three electrical leads are, therefore, fed through aperture 33, as illustrated in FIG. 2. Each of the three circuit sections is protected by a diode 36 (only two shown).

The diodes 36 prevent a back flow of current through each circuit section in the event that a short develops in a solar cell 12.

The leads from the solar panel 11 may be potted or encapsulated to protect against moisture and corrosion, if so desired.

The present mass-produced assembly allows for molded and extruded parts which reduce costs as well as provide a light-weight and aesthetically pleasing construction.

The frame members (end sections 13 and side channels 16) are colored black to provide a uniform energy absorption and temperature gradient in the module. The black frame has approximately the same absorption coefficient as the glass panel 11 and black solar cells 12.

The descriptions made herein are exemplary, it being understood that many modifications can be made within the scope of the invention.

Having thus described this invention what is desired to be protected by Letters Patent is presented by the following appended claims.

What is claimed is:

1. A mass-produced solar power module, comprising:
an array of current-generating solar cells arranged upon a substantially flat panel; and
a substantially rigid, easily assembled frame supporting said solar panel, said frame having spaced-apart side channels that each interlock with adjacent end sections about said panel to form a rigid, integral, easily-assembled, supporting frame for said panel.

2. The solar power module of claim 1, wherein each of said end sections comprise projecting tabs each of which extend into a hollow end portion of each of said channels to rigidly secure said end sections to said side channels.

3. The solar power module of claim 2, wherein each of said tabs have a snap connector which locks said tabs firmly within each hollow end portion of each of said channels to provide a rigidly fastened, interlocking integral frame for said solar panel.

4. The solar power module of claim 3, further comprising a junction box supported by said frame.

5. The solar power module of claim 4, wherein said junction box comprises injection molded plastic.

6. The solar power module of claim 4, wherein said junction box has an aperture in a mid-portion thereof, for receiving electrical leads from said solar panel.

7. The solar power module of claim 6, wherein said aperture has a substantially circumferential seal upon its periphery adjacent said solar panel.

8. The solar power module of claim 3, wherein each of said tabs has a split construction for allowing each of said tabs to compressively fit within said hollow end portion of each of said channels.

9. The solar power module of claim 1, further comprising a junction box supported by said frame.

10. The solar power module of claim 5, wherein said junction box comprises injection molded plastic.

11. The solar power module of claim 9, wherein said junction box has an aperture in a mid-portion thereof, for receiving electrical leads from said solar panel.

12. The solar power module of claim 11, wherein said aperture has a substantially circumferential seal upon its periphery adjacent said solar panel.

13. The solar power module of claim 1, wherein said side channels comprise extruded aluminum.

14. The solar power module of claim 1, wherein said end sections comprise injection molded plastic.

15. The solar power module of claim 1, wherein each of said side channels contain an internal channel for securing an anchor bolt.

16. The solar power module of claim 1, wherein said frame is substantially black in order to have approximately the same absorption coefficient as said solar cells and glass, in order to provide temperature uniformity in said module.

* * * * *